US011340456B1

(12) United States Patent
Zhu et al.

(10) Patent No.: US 11,340,456 B1
(45) Date of Patent: May 24, 2022

(54) ADDRESSABLE CROSSED LINE PROJECTOR FOR DEPTH CAMERA ASSEMBLY

(71) Applicant: Facebook Technologies, LLC, Menlo Park, CA (US)

(72) Inventors: Zhaoming Zhu, Redmond, WA (US); Mark Timothy Sullivan, Mountain View, CA (US); Jonatan Ginzburg, Sunnyvale, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 467 days.

(21) Appl. No.: 16/521,419

(22) Filed: Jul. 24, 2019

Related U.S. Application Data

(60) Provisional application No. 62/851,382, filed on May 22, 2019.

(51) Int. Cl.
| | |
|---|---|
| *G02B 27/01* | (2006.01) |
| *G06F 3/01* | (2006.01) |
| *H04N 5/232* | (2006.01) |
| *G06T 7/521* | (2017.01) |
| *G03B 21/20* | (2006.01) |
| *G01S 17/89* | (2020.01) |
| *H01S 5/183* | (2006.01) |

(52) U.S. Cl.
CPC .......... *G02B 27/0172* (2013.01); *G01S 17/89* (2013.01); *G02B 27/0179* (2013.01); *G03B 21/2033* (2013.01); *G06F 3/013* (2013.01); *G06T 7/521* (2017.01); *H04N 5/23219* (2013.01); *G02B 2027/0178* (2013.01); *G06T 2207/10028* (2013.01); *H01S 5/18302* (2013.01)

(58) Field of Classification Search
None
See application file for complete search history.

(56) References Cited

U.S. PATENT DOCUMENTS

| | | |
|---|---|---|
| 7,876,340 B2 | 1/2011 | Russell et al. |
| 8,350,847 B2 | 1/2013 | Shpunt |
| 9,443,310 B2 | 9/2016 | Hudman et al. |

(Continued)

FOREIGN PATENT DOCUMENTS

| | | | |
|---|---|---|---|
| JP | 2000318210 A | * | 11/2000 |

OTHER PUBLICATIONS

Xiong, Z. et al., "Depth sensing with focus and exposure adaptation," 2012 Visual Communications and Image Processing, IEEE, 2012, 7 pages.

(Continued)

*Primary Examiner* — Michelle M Iacoletti
*Assistant Examiner* — Danell L Owens
(74) *Attorney, Agent, or Firm* — Fenwick & West LLP

(57) ABSTRACT

A projector for illuminating a target area is presented. The projector includes an array of emitters positioned on a substrate according to a distribution. Each emitter in the array of emitters has a non-circular emission area. Operation of at least a portion of the array of emitters is controlled based in part on emission instructions to emit light. The light from the projector is configured to illuminate the target area. The projector can be part of a depth camera assembly for depth sensing of a local area, or part of an eye tracker for determining a gaze direction for an eye.

18 Claims, 11 Drawing Sheets

(56) References Cited

U.S. PATENT DOCUMENTS

| | | |
|---|---|---|
| 10,116,925 B1 | 10/2018 | Wang et al. |
| 10,181,200 B1 | 1/2019 | Chao et al. |
| 10,185,151 B2 | 1/2019 | Lee et al. |
| 10,209,202 B1 | 2/2019 | Sullivan et al. |
| 10,250,789 B2 | 4/2019 | Lee |
| 10,295,827 B1 | 5/2019 | Chao et al. |
| 10,827,163 B2 | 11/2020 | Trail et al. |
| 2003/0020705 A1 | 1/2003 | Kondo et al. |
| 2006/0103815 A1 | 5/2006 | Peterson |
| 2006/0263077 A1 | 11/2006 | Endo |
| 2010/0290698 A1 | 11/2010 | Freedman et al. |
| 2013/0076896 A1 | 3/2013 | Takabayashi et al. |
| 2013/0176533 A1 | 7/2013 | Raffle et al. |
| 2013/0215235 A1 | 8/2013 | Russell |
| 2014/0168662 A1 | 6/2014 | Takabayashi et al. |
| 2015/0229912 A1 | 8/2015 | Masalkar et al. |
| 2016/0150219 A1 | 5/2016 | Gordon et al. |
| 2016/0176533 A1* | 6/2016 | Cazals .................. B64C 11/00 244/54 |
| 2016/0274679 A1* | 9/2016 | Romano ............. H04N 13/254 |
| 2017/0264798 A1 | 9/2017 | Tanaka |
| 2017/0277950 A1 | 9/2017 | Sung et al. |
| 2017/0287157 A1 | 10/2017 | Seto |
| 2017/0337702 A1 | 11/2017 | Chang |
| 2018/0048880 A1 | 2/2018 | Trail et al. |
| 2018/0160085 A1* | 6/2018 | Bazin .................. F21V 33/0052 |
| 2018/0267663 A1 | 9/2018 | Cho et al. |
| 2019/0041197 A1* | 2/2019 | Gernoth .................... G06T 7/74 |
| 2019/0129291 A1 | 5/2019 | D'Oosterlinck |

OTHER PUBLICATIONS

United States Office Action, U.S. Appl. No. 15/886,233, dated Apr. 1, 2020, 29 pages.

United States Office Action, U.S. Appl. No. 15/886,233, dated Nov. 21, 2019, 27 pages.

United States Office Action, U.S. Appl. No. 15/886,233, dated Mar. 3, 2021, 26 pages.

United States Office Action, U.S. Appl. No. 15/886,233, dated Nov. 4, 2020, 27 pages.

United States Office Action, U.S. Appl. No. 15/886,233, dated Jul. 2, 2020, 31 pages.

United States Office Action, U.S. Appl. No. 15/886,233, dated Jan. 13, 2021, 27 pages.

* cited by examiner

500

Receive emission instructions for controlling operation of at least a portion of an array of emitters to emit light, the array of emitters positioned on a substrate according to a distribution and each emitter in the array of emitters has a non-circular emission area
510

Illuminate a target area with the light emitted by at least the portion of the array of emitters
520

FIG. 5

ADDRESSABLE CROSSED LINE PROJECTOR FOR DEPTH CAMERA ASSEMBLY

CROSS-REFERENCE TO RELATED APPLICATIONS

This application claims benefit of U.S. Provisional Patent Application Ser. No. 62/851,382, filed May 22, 2019, which is hereby incorporated by reference in its entirety.

TECHNICAL FIELD

The present disclosure generally relates to depth sensing, and specifically relates to an addressable crossed line projector for a depth camera assembly configured for three-dimensional depth sensing.

BACKGROUND

Structured light projectors are widely used in depth sensing systems. Conventional structured light based depth sensing systems are sometimes integrated with headsets. However, these systems tend to be overly large and heavy, especially, for cases where the headset is relatively small (e.g., has a form factor similar to that of a pair of eyeglasses). Accordingly, the conventional structured light based depth sensing systems are not well suited for applications where light weight and small form factor are important design criteria.

SUMMARY

A projector for illuminating a target area is presented herein. The projector includes an array of emitters positioned on a substrate according to a distribution. Each emitter in the array of emitters has a non-circular emission area. Operation of at least a portion of the array of emitters is controlled based in part on emission instructions to emit light. The light from the projector is configured to illuminate a target area. In some embodiments, the projector is part of a depth camera assembly configured to determine depth information associated with one or more objects in the target area, e.g., in a local area surrounding the projector. In some other embodiments, the projector is part of an eye tracker that determines information about gaze direction for an eye.

In some embodiments, a headset includes the projector. The headset further includes a display and an optical assembly. The headset may be part of an artificial reality system. The display is configured to emit image light. The optical assembly is configured to direct the image light to an eye-box of the headset corresponding to a location of a user's eye. The image light may comprise the depth information of the one or more objects in the local area determined by the headset. In one embodiment, the headset is implemented as an eyeglass-type platform representing a near-eye display. In another embodiment, the headset is implemented as a head-mounted display.

BRIEF DESCRIPTION OF THE DRAWINGS

FIG. 5 is a flow chart illustrating a process of illuminating a local area with light emitted by an array of emitters, in accordance with one or more embodiments.

Figure 1A:
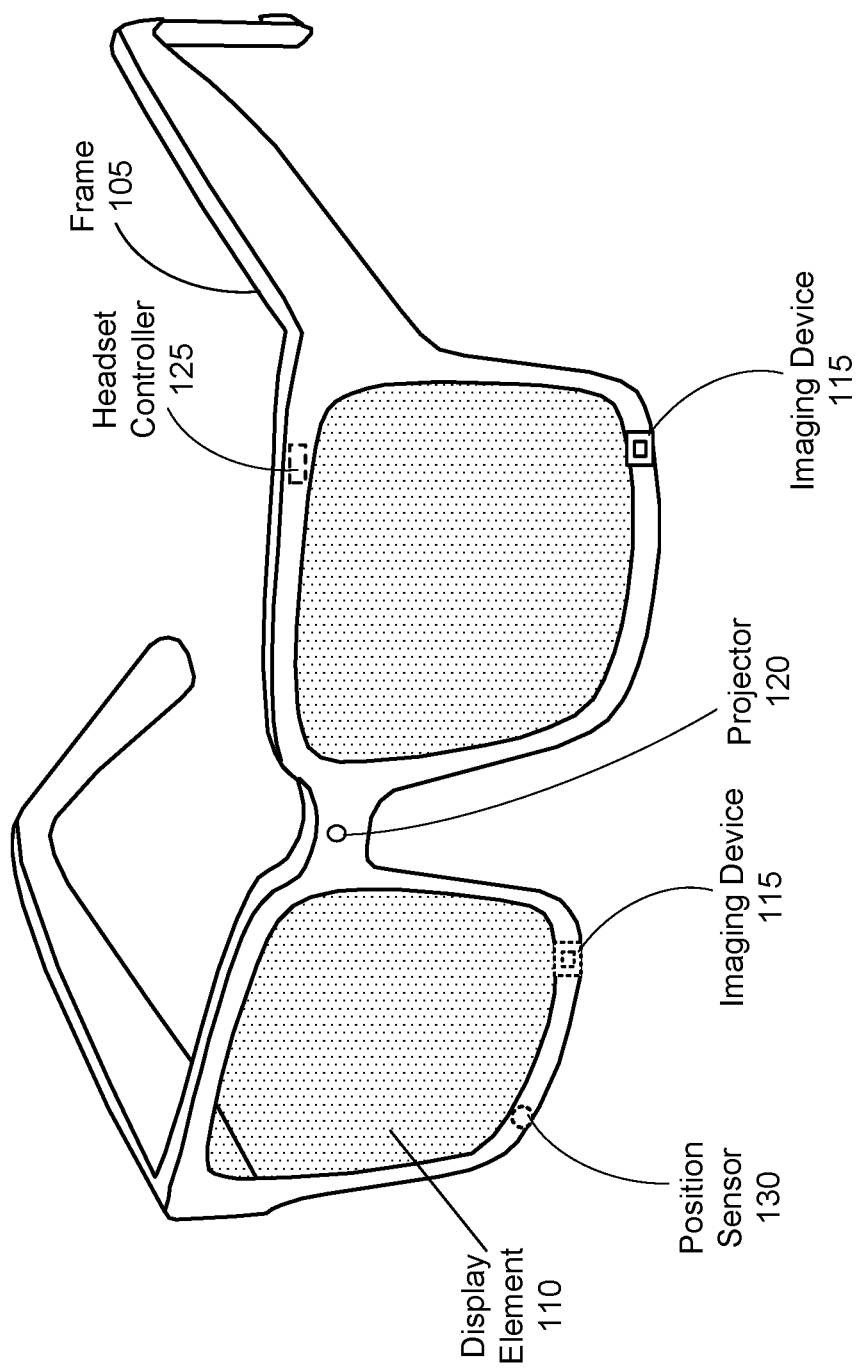
FIG. 1A is a perspective view of a headset implemented as a near-eye-display (NED), in accordance with one or more embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Embodiments of the present disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a near-eye display (NED), a mobile device or computing system, or any other hardware platform capable of providing artificial reality content to one or more viewers.

Addressable line projectors are among those projectors that make use of the addressable near infra-red (NIR) vertical cavity surface emitting laser (VCSEL) array technology that is superior than the use of edge-emitting laser diodes. Addressable VCSEL line emitters can be used in combination with one or more optical elements (e.g., a diffractive optical element) to increase a number of lines in the projection. To improve depth sensing performance (e.g., spatial resolutions), a pair of addressable line projectors can be used together to form a cross-line projector where column and row lines are both addressable. However, the use of two separate projectors is not suitable for achieving a compact form factor that is crucial in artificial reality systems.

An addressable projector with a small form factor is presented herein. The projector includes a VCSEL array and a projection lens. The VCSELs in the array have non-circular emission areas. For example, an emission area of a VCSEL may be a line segment, cross segment, etc. The VCSELs in the array are positioned on a substrate according to a distribution. The distribution may be a grid, quasi-random, random, etc. In some embodiments, the VCSELs in the array are distributed in a manner to mitigate distortion (e.g., barrel distortion or pincushion distortion) introduced by some later component and/or a factor (e.g., the projection lens), which may lead to space colinear line grids, i.e., substantially periodical grid lines with distortion below a threshold. The VCSELs in the array may be addressable in groups (e.g., column) and/or individuality addressable. At least a portion of the VCSELs emit light in accordance with emission instructions to illuminate a target area.

In some embodiments, the projector is part of a depth camera assembly (DCA) that determines depth information for one or more objects in the target area (e.g., a local area surrounding the DCA) based on light reflected from the one or more objects, the light being emitted from the projector. In some other embodiments, the projector is part of an eye tracker configured to determine a gaze direction for an eye based on light reflected from at least one surface of the eye, the light being emitted from the projector.

In some embodiments, a headset can integrate the projector as part of the DCA. Alternatively or additionally, the headset may integrate the projector as part of the eye tracker. The headset further includes a display and an optical assembly. The headset may be part of an artificial reality system. The display is configured to emit image light. The optical assembly is configured to direct the image light to an eye-box of the headset corresponding to a location of a user's eye. The image light may comprise the depth information of the one or more objects in the local area determined by the headset. In one embodiment, the headset is implemented as an eyeglass-type platform representing a NED. In another embodiment, the headset is implemented as a HMD.

FIG. 1A is a perspective view of a headset 100 implemented as a NED, in accordance with one or more embodiments. In general, the headset 100 may be worn on the face of a user such that content (e.g., media content) is presented using one or display elements 110 of the headset 100. However, the headset 100 may also be used such that media content is presented to a user in a different manner. Examples of media content presented by the headset 100 include one or more images, video, audio, or some combination thereof. The headset 100 may include, among other components, a frame 105, a display assembly including one or more display elements 110, a DCA, a headset controller 125 and a position sensor 130. While FIG. 1A illustrates the components of the headset 100 in example locations on the headset 100, the components may be located elsewhere on the headset 100, on a peripheral device paired with the headset 100, or some combination thereof.

The headset 100 may correct or enhance the vision of a user, protect the eye of a user, or provide images to a user. The headset 100 may be a NED that produces artificial reality content for the user. The headset 100 may be eyeglasses which correct for defects in a user's eyesight. The headset 100 may be sunglasses which protect a user's eye from the sun. The headset 100 may be safety glasses which protect a user's eye from impact. The headset 100 may be a night vision device or infrared goggles to enhance a user's vision at night.

The frame 105 holds the other components of the headset 100. The headset 100 includes a front part that holds the one or more display elements 110 and end pieces to attach to a head of the user. The front part of the frame 105 bridges the top of a nose of the user. The end pieces (e.g., temples) are portions of the frame 105 to which the temples of a user are attached. The length of the end piece may be adjustable (e.g., adjustable temple length) to fit different users. The end piece may also include a portion that curls behind the ear of the user (e.g., temple tip, ear piece).

The one or more display elements 110 provide light to a user wearing the headset 100. As illustrated, the headset 100 includes a display element 110 for each eye of a user. In some embodiments, a display element 110 generates image light that is provided to an eye box of the headset 100. The eye box is a location in space that an eye of user occupies while wearing the headset 100. For example, a display element 110 may be a waveguide display. A waveguide display includes a light source (e.g., a two-dimensional source, one or more line sources, one or more point sources, etc.) and one or more waveguides. Light from the light source is in-coupled into the one or more waveguides which outputs the light in a manner such that there is pupil replication in an eye box of the headset 100. In-coupling and/or outcoupling of light from the one or more waveguides may be done using one or more diffraction gratings. In some embodiments, the waveguide display includes a scanning element (e.g., waveguide, mirror, etc.) that scans light from the light source as it is in-coupled into the one or more waveguides. Note that in some embodiments, one or both of the display elements 110 are opaque and do not transmit light from a local area around the headset 100. The local area is the area surrounding the headset 100. For example, the local area may be a room that a user wearing the headset 100 is inside, or the user wearing the headset 100 may be outside and the local area is an outside area. In this context, the headset 100 generates VR content. Alternatively, in some embodiments, one or both of the display elements 110 are at least partially transparent, such that light from the local area may be combined with light from the one or more display elements to produce AR and/or MR content.

In some embodiments, a display element 110 does not generate image light, and instead is a lens that transmits light from the local area to the eye box. For example, one or both of the display elements 110 may be a lens without correction (non-prescription) or a prescription lens (e.g., single vision, bifocal and trifocal, or progressive) to help correct for defects in a user's eyesight. In some embodiments, the display element 110 may be polarized and/or tinted to protect the user's eyes from the sun.

Note that in some embodiments, the display element 110 may include an additional optics block (not shown). The optics block may include one or more optical elements (e.g., lens, Fresnel lens, etc.) that direct light from the display element 110 to the eye box. The optics block may, e.g., correct for aberrations in some or all of the image content, magnify some or all of the image, or some combination thereof.

The DCA determines depth information for a portion of a local area surrounding the headset 100. The DCA includes one or more imaging devices 115, a projector 120, and a DCA controller (not shown in FIG. 1A). In some embodiments, the projector 120 illuminates a portion of the local area with light. The light may be, e.g., structured light (e.g., dot pattern, bars, etc.) in the infrared (IR), IR flash for time-of-flight, etc. In some embodiments, the one or more imaging devices 115 capture images of the portion of the local area that include the light from the projector 120. As illustrated, FIG. 1A shows a single projector 120 and two imaging devices 115.

The DCA controller computes depth information for the portion of the local area using the captured images and one or more depth determination techniques. The depth determination technique may be, e.g., direct time-of-flight (ToF) depth sensing, indirect ToF depth sensing, structured light, passive stereo analysis, active stereo analysis (uses texture added to the scene by light from the projector 120), some other technique to determine depth of a scene, or some combination thereof.

Based on the determined depth information, the DCA controller may determine absolute positional information of the headset 100 within the local area. The DCA controller may also generate a model of the local area. The one or more imaging devices 115 may be integrated with the headset 100 or may be positioned within the local area external to the headset 100. In some embodiments, the DCA controller may provide the depth image data to the headset controller 125 integrated into the headset 100, e.g. for further processing and/or communication to some other component of an artificial reality system that includes the headset 100. The one or more imaging devices 115 may be part of simultaneous localization and mapping (SLAM) sensors mounted on the headset 100 for capturing visual information of a local area surrounding some or all of the headset 100.

The headset controller 125 may control operations of one or more components of the headset 100 including the projector 120. The headset controller 125 may receive the depth image data from the DCA controller and perform additional processing on the depth image data. In some embodiments, the headset controller 125 may control operations of components of an audio system integrated into the headset 100 (not shown in FIG. 1A). The headset controller 125 may include a communication module (e.g., a transceiver) for data communication (e.g., wireless communication) with some other external component of the artificial reality system, e.g., a server and/or a console (not shown in FIG. 1A).

The position sensor 130 generates one or more measurement signals in response to motion of the headset 100. The position sensor 130 may be located on a portion of the frame 105 of the headset 100. The position sensor 130 may include a position sensor, an inertial measurement unit (IMU), or both. Some embodiments of the headset 100 may or may not include the position sensor 130 or may include more than one position sensors 130. In embodiments in which the position sensor 130 includes an IMU, the IMU generates IMU data based on measurement signals from the position sensor 130. Examples of position sensor 130 include: one or more accelerometers, one or more gyroscopes, one or more magnetometers, another suitable type of sensor that detects motion, a type of sensor used for error correction of the IMU, or some combination thereof. The position sensor 130 may be located external to the IMU, internal to the IMU, or some combination thereof.

Based on the one or more measurement signals, the position sensor 130 estimates a current position of the headset 100 relative to an initial position of the headset 100. The estimated position may include a location of the headset 100 and/or an orientation of the headset 100 or the user's head wearing the headset 100, or some combination thereof. The orientation may correspond to a position of each ear relative to a reference point. In some embodiments, the position sensor 130 uses the depth information and/or the absolute positional information from the DCA to estimate the current position of the headset 100. The position sensor 130 may include multiple accelerometers to measure translational motion (forward/back, up/down, left/right) and multiple gyroscopes to measure rotational motion (e.g., pitch, yaw, roll). In some embodiments, an IMU rapidly samples the measurement signals and calculates the estimated position of the headset 100 from the sampled data. For example, the IMU integrates the measurement signals received from the accelerometers over time to estimate a velocity vector and integrates the velocity vector over time to determine an estimated position of a reference point on the headset 100. The reference point is a point that may be used to describe the position of the headset 100. While the reference point may generally be defined as a point in space, however, in practice the reference point is defined as a point within the headset 100.

Figure 1B:
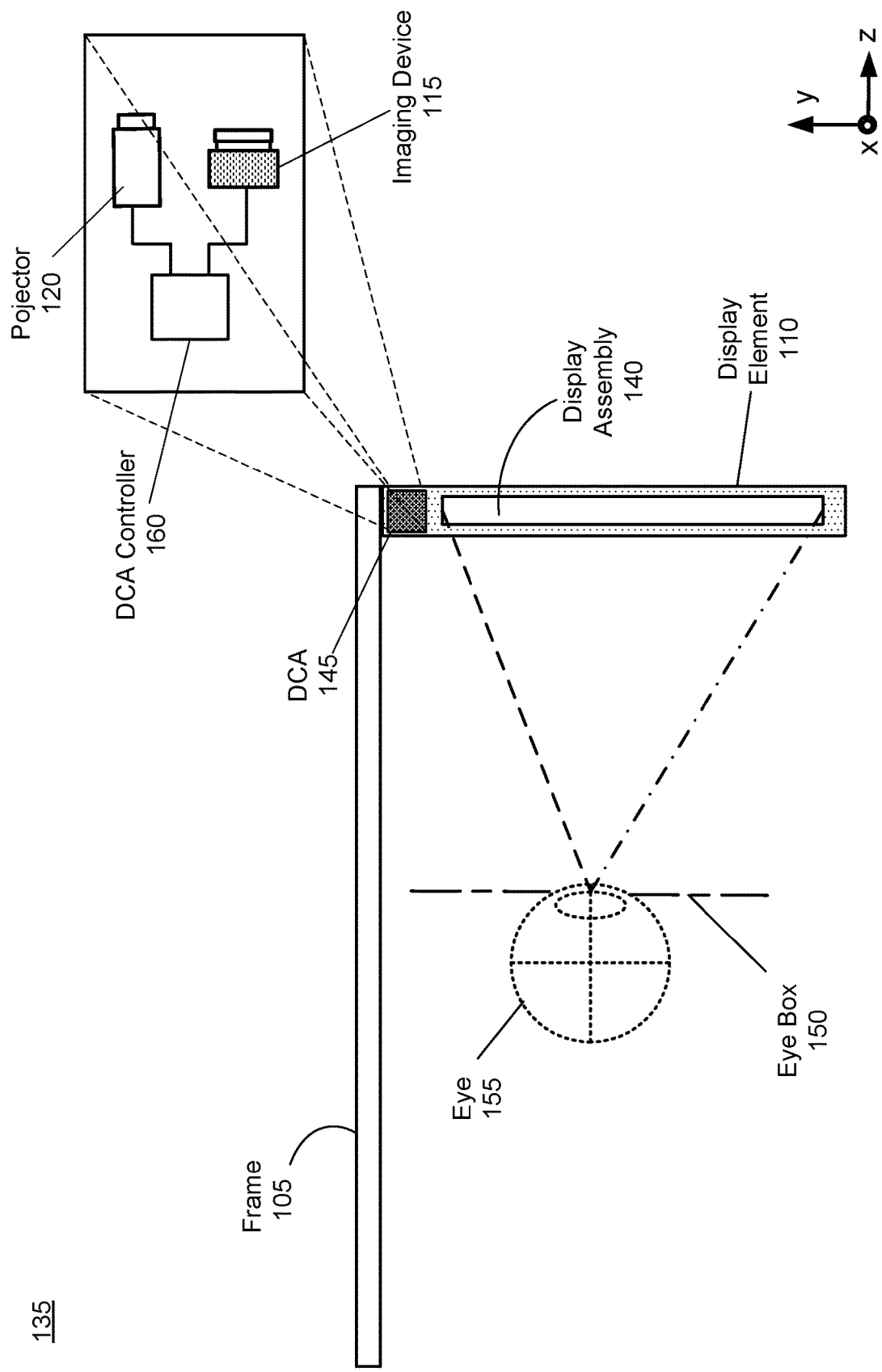
FIG. 1B is a cross-section of an eyewear of the headset in FIG. 1A, in accordance with one or more embodiments.

FIG. 1B is a cross section 135 of an eyewear of the headset 100 illustrated in FIG. 1A, in accordance with one or more embodiments. The cross section 135 may include at least one display assembly 140 integrated into the display element 110, a DCA 145, and an eye box 150. The eye box 150 is a location where an eye 155 is positioned when a user wears the headset 100. In some embodiments, the frame 105 may represent a frame of eye-wear glasses. For purposes of illustration, FIG. 1B shows the cross section 135 associated with a single eye 155 and a single display assembly 140, but in alternative embodiments not shown, another display assembly which is separate from the display assembly 140 shown in FIG. 1B, provides image light to another eye 155 of the user.

The display assembly 140 is configured to direct the image light to the eye 155 through the eye box 150. In some embodiments, when the headset 100 is configured as an AR NED, the display assembly 140 also directs light from a local area surrounding the headset 100 to the eye 155 through the eye box 150. The display assembly 140 may be configured to emit image light at a particular focal distance in accordance with varifocal instructions, e.g., provided from a varifocal module (not shown in FIG. 1B).

The display assembly 140 may be composed of one or more materials (e.g., plastic, glass, etc.) with one or more refractive indices that effectively minimize the weight and present to the user a field of view of the headset 100. In alternate configurations, the headset 100 includes one or more optical elements between the display assembly 140 and the eye 155. The optical elements may act to, e.g., correct aberrations in image light emitted from the display assembly 140, magnify image light, perform some other optical adjustment of image light emitted from the display assembly 140, or some combination thereof. The example for optical elements may include an aperture, a Fresnel lens, a convex lens, a concave lens, a liquid crystal lens, a diffractive element, a waveguide, a filter, a polarizer, a diffuser, a fiber taper, one or more reflective surfaces, a polarizing reflective surface, a birefringent element, or any other suitable optical element that affects image light emitted from the display assembly 140.

The frame 105 further includes the DCA 145 configured to determine depth information of one or more objects in a local area surrounding some or all of the headset 100. For purposes of illustration, FIG. 1B shows the cross section 135 associated with a portion of the frame 105 including the DCA 145. However, the DCA 145 may be integrated into another portion of the frame 105. The DCA 145 includes the projector 120, the imaging device 115, and a DCA controller 160 that may be coupled to at least one of the projector 120 and the imaging device 115. In some embodiments (now shown in FIG. 1B), the projector 120 and the imaging device 115 each may include its own internal controller. In some embodiments (not shown in FIG. 1B), the projector 120 and the imaging device 115 can be widely separated, e.g., the projector 120 and the imaging device 115 can be located in different assemblies. In some embodiments (not shown in FIG. 1B), the DCA 145 includes one or more additional imaging devices 115.

The projector 120 may be configured to illuminate the local area with light in accordance with emission instructions generated by the DCA controller 160. The projector 120 may be implemented as an addressable crossed line projector. The projector 120 may include an array of emitters, and at least a portion of the emitters in the array emit light simultaneously. The emitters in the array of the projector 120 are positioned on a substrate according to a distribution, and each emitter in the array of emitters of the projector 120 has a non-circular emission area. At least the portion of the emitters in the array of the projector 120 emit light in a near infra-red (NIR) spectrum, e.g., having one or more wavelengths between approximately 780 nm and 2500 nm. The emitted NIR light may be then projected into the scene by a projection lens of the projector 120 (not shown in FIG. 1B). Each emitter in the array of the projector 120 may be implemented as a VCSEL emitter that emits in, e.g., the NIR spectrum. In accordance with embodiments of the present disclosure, the projector 120 can be implemented as a versatile and yet power efficient NIR illuminator, which can be utilized with most depth sensing techniques, such as structured light based depth sensing, ToF based depth sensing, active stereo vision depth sensing, hybrid depth sensing combining structured light based depth sensing and ToF based depth sensing, etc. More details about a structure and operation of the projector 120 are disclosed in conjunction with FIGS. 3A-3B, FIGS. 4A-4D, FIG. 5.

The imaging device 115 includes one or more cameras configured to capture one or more images of at least a portion of the light reflected from one or more objects in the local area. In one embodiment, the imaging device 115 is an infrared camera configured to capture images in a NIR spectrum. Additionally, the imaging device 115 may be also configured to capture images of visible spectrum light. The imaging device 115 may include a charge-coupled device (CCD) detector, a complementary metal-oxide-semiconductor (CMOS) detector or some other types of detectors (not shown in FIG. 1B). The imaging device 115 may be configured to operate with a frame rate in the range of approximately 30 Hz to approximately 1 KHz for fast detection of objects in the local area. In some embodiments, the imaging device 115 is deactivated for a defined amount of time before being activated again. Alternatively or additionally, the imaging device 115 can operate as instructed by the DCA controller 160 for single or multiple frames, up to a maximum frame rate, which can be in the kilohertz range.

The DCA controller 160 may generate the emission instructions and provide the emission instructions to the projector 120 for controlling operation of at least a portion of emitters in the array in the projector 120 to emit light. The DCA controller 160 may control, based on the emission instructions, operation of the projector 120 to dynamically adjust a pattern of the light illuminating the local area, an intensity of the light pattern, a density of the light pattern, location of the light being projected at the local area, combination thereof, etc. The DCA controller 160 may be also configured to determine depth information for the one or more objects in the local area based in part on the one or more images captured by the imaging device 115. In some embodiments, the DCA controller 160 provides the determined depth information to a console (not shown in FIG. 1B) and/or an appropriate module of the headset 100 (e.g., a varifocal module, not shown in FIG. 1B). The console and/or the headset 100 may utilize the depth information to, e.g., generate content for presentation on the display assembly 140. More details about controlling operation of the projector 120 and determining depth information by the DCA controller 160 are disclosed in conjunction with FIGS. 3A-3B, FIG. 5.

In some embodiments, the headset 100 further includes an eye tracker (not shown in FIG. 1B) for determining and tracking a position of the eye 155, i.e., an angle and orientation of eye-gaze. Note that information about the position of the eye 155 also includes information about an orientation of the eye 155, i.e., information about user's eye-gaze. Based on the determined and tracked position and orientation of the eye 155, the headset 100 adjusts image light emitted from the display assembly 140. In some embodiments, the headset 100 adjusts focus of the image light and ensures that the image light is in focus at the determined angle of eye-gaze in order to mitigate the vergence-accommodation conflict. Additionally or alternatively, the headset 100 adjusts resolution of the image light by performing foveated rendering of the image light, based on the position of the eye 150. Additionally or alternatively, the headset 100 uses the information on a gaze position and orientation to provide contextual awareness for the user's attention, whether on real or virtual content. The eye tracker generally includes an illumination source and an imaging device (camera). In some embodiments, components of the eye tracker are integrated into the display assembly 140. In alternate embodiments, components of the eye tracker are integrated into the frame 105. In some embodiments, the illumination source of the eye tracker has the same structure and operates in the same manner as the projector 120.

Figure 2A:
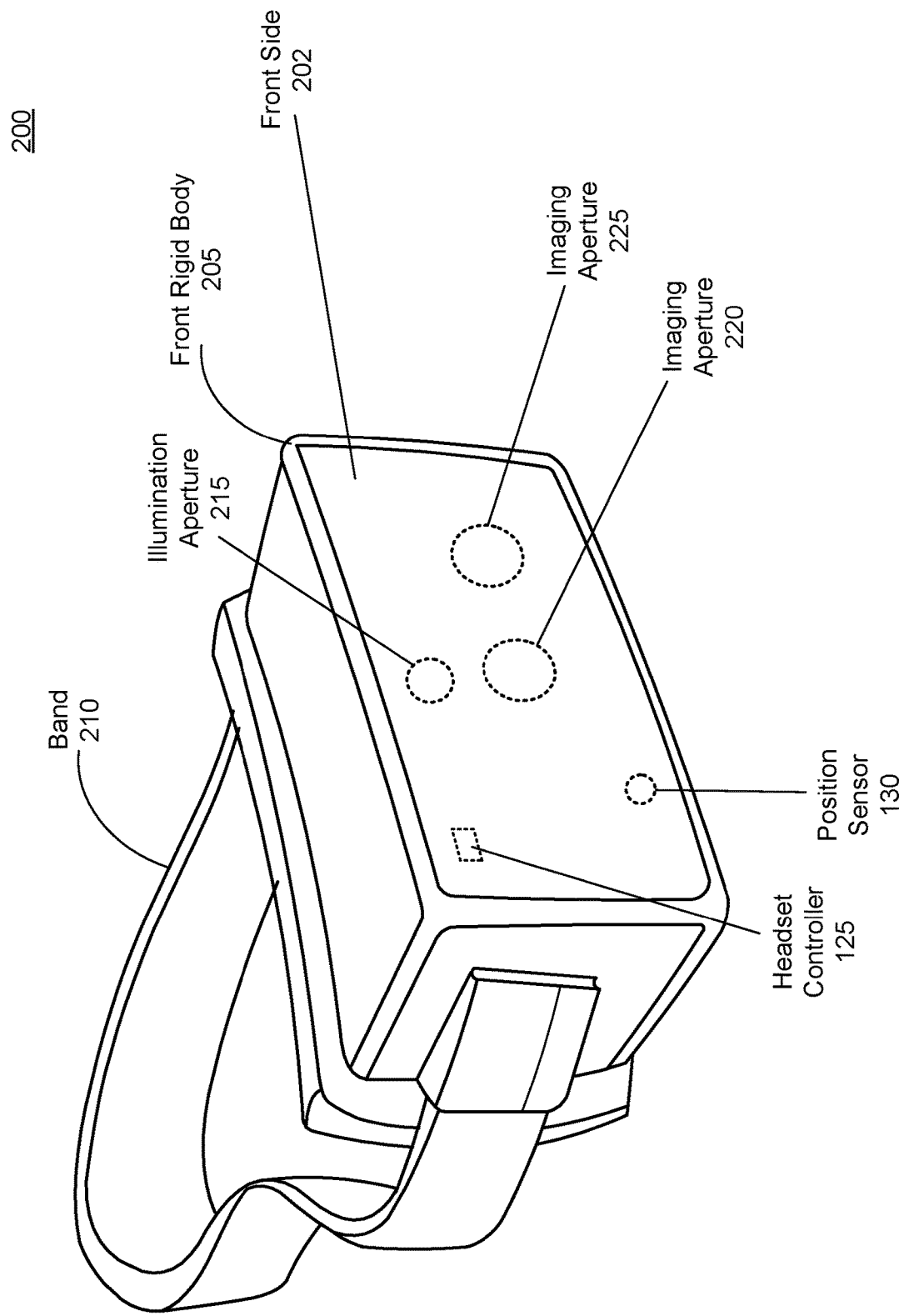
FIG. 2A is a perspective view of a headset implemented as a head-mounted display (HMD), in accordance with one or more embodiments.

FIG. 2A is a perspective view of a headset 200 implemented as a HMD, in accordance with one or more embodiments. In embodiments that describe an AR system and/or a MR system, portions of a front side 202 of the headset 200 are at least partially transparent in the visible band (~380 nm to 750 nm), and portions of the headset 200 that are between the front side 202 and an eye of the user are at least partially transparent (e.g., a partially transparent electronic display). The headset 200 includes a front rigid body 205 and a band 210. The headset 200 includes many of the same components described above with reference to FIG. 1A, but modified to integrate with the HMD form factor. For example, the headset 200 includes a display assembly, a DCA, an audio system, and one or more position sensors 130. The front rigid body 205 includes one or more electronic display elements (not shown in FIG. 2A), one or more integrated eye tracking systems (not shown in FIG. 2A), and the one or more position sensors 130. The position sensors 130 may be located within an IMU, and neither the IMU nor the position sensors 130 are visible to a user of the headset 200.

FIG. 2A further shows an illumination aperture 215 associated with the projector 120, and imaging apertures 220, 225 associated with the imaging devices 115. The projector 120 emits light (e.g., a structured light pattern) through the illumination aperture 215. The one or more imaging devices 115 capture light that is reflected from the local area through at least one of the imaging apertures 220, 225.

Figure 2B:
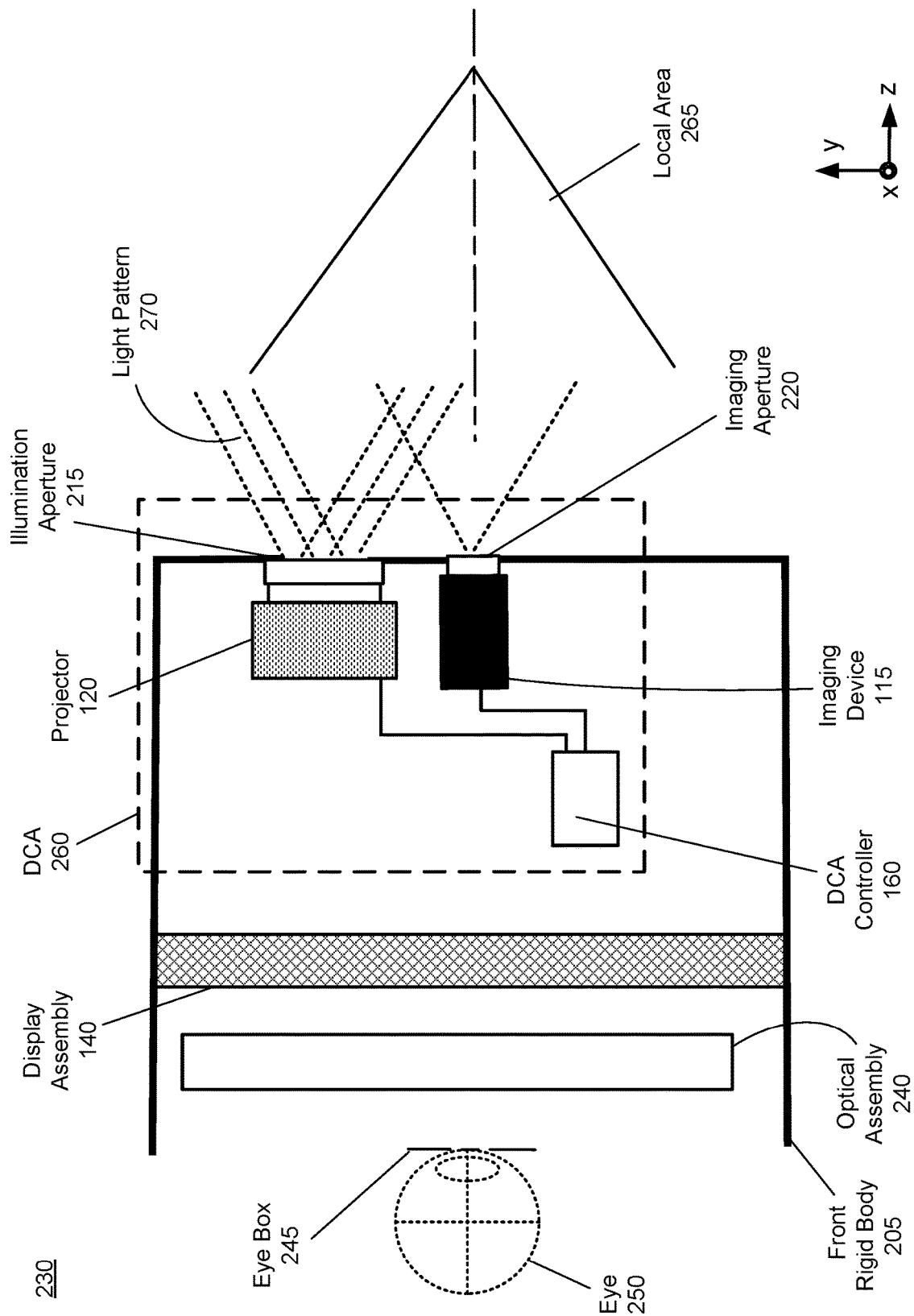
FIG. 2B is a cross section of a front rigid body of the headset in FIG. 2A, in accordance with one or more embodiments.

FIG. 2B is a cross section 230 of the front rigid body 205 of the headset 200 shown in FIG. 2A, in accordance with one or more embodiments. As shown in FIG. 2B, the front rigid body 205 includes a display assembly 140 and an optical assembly 240 that together provide image light to an eye box 245. The eye box 245 is the location of the front rigid body 205 where a user's eye 250 is positioned. The eye-box 245 represents a three-dimensional volume at an output of the headset 200 in which the user's eye 250 is located to receive image light. For purposes of illustration, FIG. 2B shows a cross section 230 associated with a single eye 250, but another optical assembly 240, separate from the optical assembly 240, provides altered image light to another eye of the user. The front rigid body 205 also has an optical axis corresponding to a path along which image light propagates through the front rigid body 205.

The display assembly 140 generates image light. In some embodiments, the display assembly 140 includes an optical element that adjusts the focus of the generated image light. The display assembly 140 displays images to the user in accordance with data received from a console (not shown in FIG. 2B). In various embodiments, the display assembly 140 may comprise a single electronic display or multiple electronic displays (e.g., a display for each eye of a user). Examples of the display assembly 140 include: a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, some other display, a projector, or some combination thereof. The display assembly 140 may also include an aperture, a Fresnel lens, a convex lens, a concave lens, a diffractive element, a waveguide, a filter, a polarizer, a diffuser, a fiber taper, a reflective surface, a polarizing reflective surface, or any other suitable optical element that affects the image light emitted from the electronic display. In some embodiments, one or more of the display block optical elements may have one or more coatings, such as anti-reflective coatings.

The optical assembly 240 magnifies received light from the display assembly 140, corrects optical aberrations associated with the image light, and the corrected image light is presented to a user of the headset 200. At least one optical element of the optical assembly 240 may be an aperture, a Fresnel lens, a refractive lens, a reflective surface, a diffractive element, a waveguide, a filter, or any other suitable optical element that affects the image light emitted from the display assembly 140. Moreover, the optical assembly 240 may include combinations of different optical elements. In some embodiments, one or more of the optical elements in the optical assembly 240 may have one or more coatings, such as anti-reflective coatings, dichroic coatings, etc. Magnification of the image light by the optical assembly 240 allows elements of the display assembly 140 to be physically smaller, weigh less, and consume less power than larger displays. Additionally, magnification may increase a field-of-view of the displayed media. For example, the field-of-view of the displayed media is such that the displayed media is presented using almost all (e.g., 110 degrees diagonal), and in some cases all, of the user's field-of-view. In some embodiments, the optical assembly 240 is designed so its effective focal length is larger than the spacing to the display assembly 140, which magnifies the image light projected by the display assembly 140. Additionally, in some embodiments, the amount of magnification may be adjusted by adding or removing optical elements.

As shown in FIG. 2B, the front rigid body 205 further includes a DCA 260 for determining depth information of one or more objects in a local area 265 surrounding some or all of the headset 200. The DCA 260 includes a projector 120, one or more imaging devices 115, and a DCA controller 160. The projector 120 emits a light pattern 270 through the illumination aperture 215 in accordance with emission instructions generated by the DCA controller 160. The imaging device 115 is configured to capture, through the imaging aperture 220, at least a portion of the light pattern 270 reflected from one or more objects in the local area 265. The DCA controller 160 generates the emission instructions for the projector 120 for controlling operation of at least a portion of emitters in the array emitters within of the projector 120. The DCA controller 160 is also configured to determine depth information for one or more objects in the local area 265 based in part on the one or more images captured by the one or more imaging devices 115. In some embodiments, the DCA controller 160 provides the determined depth information to a console (not shown in FIG. 2B) and/or an appropriate module of the headset 200 (e.g., a varifocal module, not shown in FIG. 2B). The console and/or the headset 200 may utilize the depth information to, e.g., generate content for presentation on the display assembly 140.

In some embodiments, the front rigid body 205 further comprises an eye tracking system (not shown in FIG. 2B) that determines eye tracking information for the user's eye 250. The determined eye tracking information may comprise information about an orientation of the user's eye 250 in the eye box 245, i.e., information about an angle of an eye-gaze. In one embodiment, the user's eye 250 is illuminated with a structured light pattern generated by, e.g., the same type of an illumination source as the projector 120. The eye tracking system can use locations of the reflected structured light pattern in a captured image to determine eye position and eye-gaze. In another embodiment, the eye tracking system determines eye position and eye-gaze based on magnitudes of image light captured over a plurality of time instants.

In some embodiments, the front rigid body 205 further comprises a varifocal module (not shown in FIG. 2B). The varifocal module may adjust focus of one or more images displayed on the display assembly 140, based on the eye tracking information. In one embodiment, the varifocal module adjusts focus of the displayed images and mitigates vergence-accommodation conflict by adjusting a focal distance of the optical assembly 240 based on the determined eye tracking information. In another embodiment, the varifocal module adjusts focus of the displayed images by performing foveated rendering of the one or more images based on the determined eye tracking information. In yet another embodiment, the varifocal module utilizes the depth information from the DCA controller 160 to generate content for presentation on the display assembly 140.

Figure 3A:
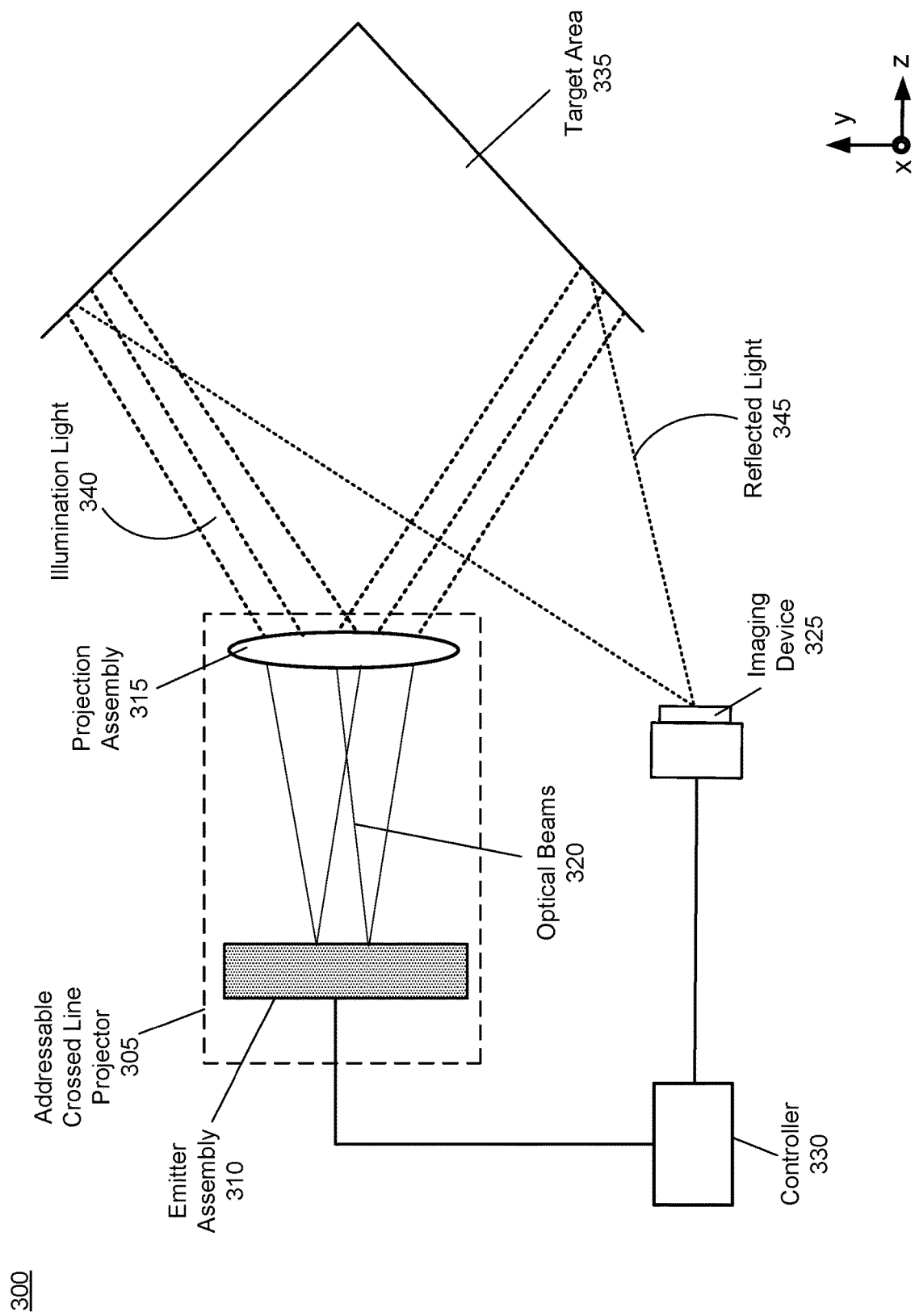
FIG. 3A is an example depth camera assembly (DCA) with an addressable crossed line projector, in accordance with one or more embodiments.

FIG. 3A is an example DCA 300 with an addressable crossed line projector 305, in accordance with one or more embodiments. The DCA 300 is configured for depth sensing of a target area 335 using a pattern of illumination light 340. The target area 335 may be an eye box or a portion of a local area at least partially surrounding the DCA 300. The DCA 300 includes the projector 305, an imaging device 325, and a controller 330 coupled to both the projector 305 and the imaging device 325. The DCA 300 may be integrated as part of a headset, e.g., the headset 100 and/or the headset 200. The DCA 300 may be an embodiment of the DCA 145 of FIG. 1B or the DCA 260 of FIG. 2B; the projector 305 may be an embodiment of the projector 110; the imaging device 325 may be an embodiment of the imaging device 115; and the controller 330 may be an embodiment of the DCA controller 160. Alternatively, the DCA 300 may be part of an eye tracker.

The projector 305 is configured to emit the pattern of illumination light 340 in accordance with emission instructions from the controller 330. The pattern of illumination light 340 is emitted from the projector 305 for illumination and scanning of the target area 335. The projector 305 includes an emitter assembly 310 and a projection assembly 315 position in front of the emitter assembly 310. The emitter assembly 310 emits optical beams 320 toward the projection assembly 315 in accordance with emission instructions from the controller 330.

The projection assembly 315 projects the optical beams 320 as the illumination light 340 into the target area 335. The projection assembly 315 is positioned in front of the emitter assembly 310 to receive the optical beams 320 emitted from the emitter assembly 310. The projection assembly 315 includes one or more optical elements, e.g., refractive, reflective and/or diffractive elements such as lenses that generate the illumination light 340 from the optical beams 320. A pattern of the illumination light 340 may be dynamically adjustable and variable over time based in part on the emission instructions from the controller 330 that controls operations of one or more emitters in the emitter assembly 310. The illumination light 340 comprises a structured light pattern. In some embodiments, the illumination light 340 is temporally modulated. The illumination light 340 illuminates one or more portions of the target area 335, including one or more objects in the target area 335. As the pattern of the illumination light 340 is dynamically adjustable over time, different portions of the target area 335 may be illuminated in different time instants. The illumination light 340 may illuminate one or more non-circular shapes of the target area 335 defined by a shape of a pattern of the illumination light 340 as appears on a surface within the target area 335. Reflected light 345 may be generated based on reflection of the illumination light 340 from the one or more objects in the target area 335.

The imaging device 325 captures one or more images of the one or more objects in the target area 335 by capturing at least a portion of the reflected light 345. In one embodiment, the imaging device 325 is an infrared camera configured to capture images that include the NIR spectrum. The imaging device 325 may include a charge coupled device (CCD) detector, a complementary metal-oxide-semiconductor (CMOS) detector or some other types of detectors for capturing images that include the NIR spectrum. The imaging device 325 is substantially same as the imaging device 115. In some embodiments, the imaging device 325 includes a two-dimensional detector pixel array for capturing at least the portion of the reflected light 345. In other embodiments, the imaging device 325 includes more than one camera for capturing at least the portion of the reflected light 345 in stereo. In some embodiments, the illumination light 340 comprises a temporally modulated light pattern, and the imaging device 325 is configured to capture the one or more images of at least a portion of the temporally modulated light pattern reflected from the one or more objects in the target area 335.

The controller 330 generates the emission instructions and provides the emission instructions to the emitter assembly 310. The controller 330 may control operation of at least a portion of emitters in the emitter assembly 310, based in part on the emission instructions. In one embodiments, the controller 330 controls operation of at least the portion of emitters in the emitter assembly 310 by controlling at least one column of the emitters, based in part on the emission instructions. In such case, the controller 330 may activate at least one column of the emitters to emit the optical beams 320, based in part on the emission instructions. In another embodiment, the controller 330 controls operation of at least one emitter in the emitter assembly 310, based in part on the emission instructions. In such case, the controller 330 may activate at least one emitter in the emitter assembly 310 to emit the optical beams 320, based in part on the emission instructions. In yet another embodiment, the controller 330 controls operation of one or more emitters in the emitter assembly 310, based at least in part on depth information for the target area 335. In some embodiments, the controller 330 initially generates emission instructions to activate all emitters in the emitter assembly 310 to emit light. After identifying one or more objects of interest in a particular area (e.g., hands of a user of the headset), the controller 330 may be configured to generate emission instructions to activate at least a portion of the emitters in the emitter assembly 310 such that the emitter assembly 310 generates structured light in the regions including the objects of interest.

The controller 330 is further coupled to the imaging device 325 and can be configured to determine depth information for the one or more objects in the target area 335. The controller 330 determines depth information for the one or more objects based in part on the one or more images captured by the imaging device 325. The controller 325 may be configured to determine the depth information based on spatially shifted patterns of the reflected light 345 captured by the imaging device 325 distorted by shapes of the one or more objects in the target area 335, and to use triangulation calculation to obtain a depth map of the target area 335. Alternatively, the controller 350 may be configured to determine the depth information based on time-of-flight information and/or information about a pattern of the reflected structured light 345 distorted by shapes of the one or more objects in the target area 335. In some embodiments, the controller 330 can be configured to determine the depth information based on polarization information of the reflected light 345 and/or polarization information of the illumination light 340. In some embodiments, when the DCA 300 is part of an eye tracker and the target area 335 includes the eye box of the headset, the controller 350 determines a gaze direction for the eye based on one or more images of at least one surface of the eye captured by the imaging device 325.

In some embodiments, for structured-light depth sensing, the stability of the pattern of illumination light 340, the imaging device 325, as well as the entire DCA 300 can be critical to maintain performance. The built-in features of the pattern of illumination light 340, such as straight lines, crosses, and density variation can be utilized to check the DCA 300 against its initial calibration to ensure high performance of depth sensing. For example, a set of pattern features of the illumination light 340 (e.g., grid points) with known angular information can be checked by the imaging device 325 using an initial calibration parameter to determine errors that can occur in relation to the accuracy of imaging device 325 or relative positioning of the imaging device 325 with respect to the projector 305. Re-calibration may be performed with the use of such pattern features, which allows "on-line" calibration through, e.g., computer vision optimization methods, such as the bundle adjustment method. Similarly, these pattern features can be used for checking the stereo vision calibration and for re-calibration of the stereo vision system when necessary, even though the projector 305 itself does not impact the stereo vision as much as in the case of structured-light depth sensing. The stereo vision calibration of the DCA 300 may be performed using known features of the pattern of illumination light 340, enabling both cameras of the imaging device 325 to carry out optimization to update parameters of the stereo vision system.

Figure 3B:
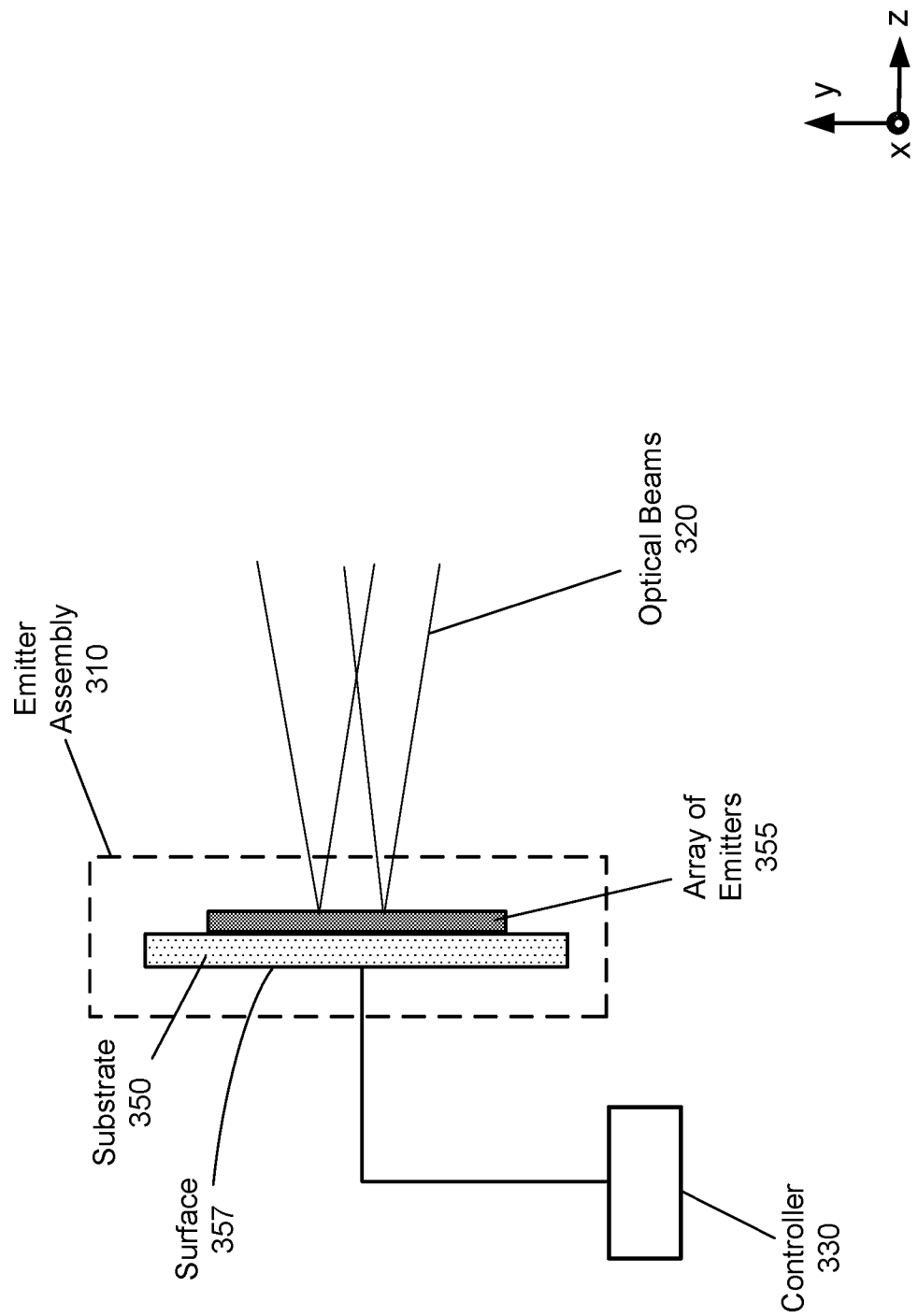
FIG. 3B is a cross-section view of an emitter assembly of the addressable crossed line projector in FIG. 3A, in accordance with one or more embodiments.

FIG. 3B is a cross-section view of the emitter assembly 310 of the addressable crossed line projector 305, in accordance with one or more embodiments. As shown in FIG. 3B, the emitter assembly 310 includes a substrate 350 and an array of emitters 355. In some embodiments, each emitter in the array of emitters 355 is a VCSEL. The array of emitters 355 is positioned on the substrate 350 according to a predetermined distribution. In some embodiments, the emitters in the array 355 are positioned on the substrate 350 according to the distribution substantially similar to a grid distribution. In some other embodiments, the emitters in the array 355 are positioned on the substrate 350 according to the distribution substantially similar to a quasi-random distribution. The emitters in the array 355 may be positioned on the substrate 350 according to a distribution to mitigate distortion (e.g., barrel distortion or pincushion distortion) of the optical beams 320 by, e.g., the projection assembly 315 that projects the optical beams 320 into the target area 335 as illumination light 340.

Each emitter in the array of emitters 355 has a non-circular emission area. The emitters in the array of emitters 355 can emit light in the same band or in different bands. In some embodiments, the non-circular emission area is a line segment, e.g., a straight line segment or a curved line segment. In some other embodiments, the non-circular emission area is a cross segment. The cross segment may represent at least two line segments that are crossed, e.g., in the middle. In one embodiment, the two line segments forming the cross segment cross each other orthogonally. In another embodiment, the two line segments forming the cross segment cross each other at an angle different than 90°. Operation of at least a portion of the array of emitters 355 is controlled based in part on the emission instructions from the controller 330 to emit the optical beams 320. The optical beams 320 may represent a light pattern of repeated non-circular shapes, where each shape is defined by one or more respective non-circular emission areas of emitters within the array of emitters 355. More details about a structure and operation of the array of emitters 355 are provided in conjunction with FIGS. 4A-4C.

As discussed above, the array of emitters 355 may be implemented as an array of VCSEL emitters. In some embodiments, as shown in FIG. 3B, the controller 330 is coupled to the array of emitters 355 via the substrate 350 for controlling operations of one or more emitters in the array 355. In some other embodiments (not shown in FIG. 3B), instead of the controller 330, a surface 357 of the substrate 350 is applied on a driver chip that controls operations of one or more VCSEL emitters in the array of emitters 355. In such case, the array of emitters 355 may be designed as a VCSEL line array that enables line addressability. Depending on a line pitch requirement, different VCSEL technology and driver integration/packaging can be used. For example, the oxide-confinement VCSEL technology can achieve line pitch down to approximately 10 μm, and the oxide-free (lithographic) VCSEL technology can achieve even smaller pitch, e.g., approximately 3 μm. With the small line pitch, the bottom emitting VCSEL and flip-chip bonding technology can be used to achieve a compact package where a VCSEL chip comprising the array of emitters 355 and the substrate 350 is placed on top of the driver chip. In one embodiment, the VCSEL chip comprising the array of emitters 355 and the substrate 350 is stacked to the driver chip using e.g., the flip-chip bonding process. The individual emitter block (e.g., line, line segment, cross, etc.) may be formed in the standard VCSEL process, e.g., the oxide-confinement or the oxide-free technology.

Figure 4A:
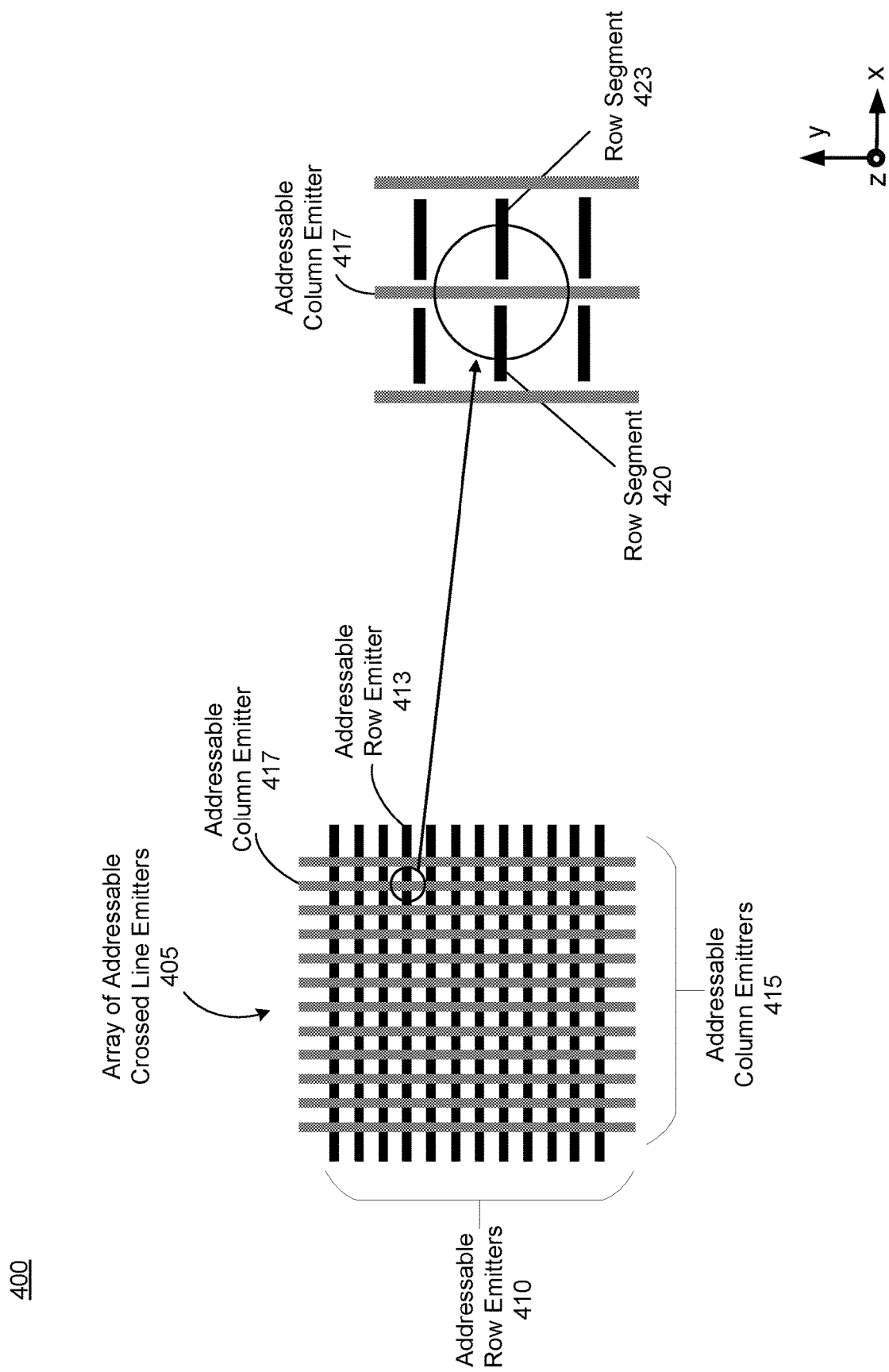
FIG. 4A is a top view of an array of addressable crossed line emitters in the emitter assembly, which may be part of the addressable crossed line projector in FIG. 3A, in accordance with one or more embodiments.

FIG. 4A is a top view 400 of an array of addressable crossed line emitters 405, which may be part of the addressable crossed line projector 305 in FIG. 3A, in accordance with one or more embodiments. The array of addressable crossed line emitters 405 may be an embodiment of the array of emitters 355 of FIG. 3B. The array of addressable crossed line emitters 405 is implemented as a two-dimensional array comprising an array of addressable row emitters 410 and an array of addressable column emitters 415. The array of addressable crossed line emitters 405 may be implemented as an array of VCSEL emitters that are integrated into a VCSEL chip. Implementation of an addressable crossed line projector (e.g., the projector 305) based on crossing of arrays of the addressable row emitters 410 and the addressable column emitters 415 facilitates a compact form factor of the projector as part of a DCA integrated into a headset that is critical for artificial reality systems. In addition to the compact form factor, the implementation shown in FIG. 4A allows for higher intensity of light emission from a smaller chip area, thus providing a power efficient addressable crossed line projector.

Emitters in the array of addressable crossed line emitters 405 may be implemented as VCSEL emitters integrated into a substrate (e.g., the substrate 350) that form an emission area on the substrate having a non-circular shape (e.g., line segment shape, cross segment shape, etc.). The non-circular emission area of emitters in the array of addressable crossed line emitters 405 is in contrast with the conventional circular shape of emission areas.

In the illustrative embodiment of FIG. 4A, the addressable column emitters 415 are implemented as whole column line emitters each of which can be driven individually. A single column (e.g. an addressable column emitter 417) may include a plurality of emitters with a line segment shaped emission area, where the emitters are positioned to form the column (e.g., short end to short end). In some embodiments, a distribution of the emitters that form the column may be altered to mitigate distortion caused by the projection assembly 315, e.g., barrel distortion or pincushion distortion. For example, instead of the straight column, emitters of the addressable column emitter 417 may be distributed in the substrate to form a curved column-like emission area.

The addressable row emitters 410 are divided, e.g., by the addressable column emitters 415, into row segments. For example, as shown in FIG. 4A, an addressable row emitter 413 is divided by the addressable column emitter 417 into row segments 420, 423. Each row segment may include one or more emitters having a line segment shaped emission area, where the emitters are positioned to form the row segment. In some embodiments, a distribution of the emitters in the row segment may be altered to mitigate distortion caused by the projection assembly 315. In one embodiment, row segments of an addressable row emitter (e.g., the row segments 420, 423) can be driven individually for light emission. In such case, segments of a row are addressable components. For example, some segments in the addressable row emitter 413 can be activated for light emission while some other segments in the addressable row emitter 413 can be deactivated. In another embodiment, all row segments of an addressable row emitter (e.g., the addressable row emitter 413) can be driven collectively for light emission as a row of segments to reduce the complexity of a controller (driver) controlling operations of the addressable crossed line emitters 405. In such case, the entire row is a single illumination unit. The implementation of the array of addressable crossed line emitters 405 shown in FIG. 4A is only illustrative and other implementations of addressable columns and rows emitters are possible.

In some embodiments, the operation of each addressable emitter (e.g., row segment or column segment) in the array of addressable crossed line emitters 405 can be controlled by emission instructions (e.g., from a controller or driver, not shown in FIG. 4A) generated based on depth information for a local area, thus achieving better use of illumination for depth determination performance. Some examples of operational modes of the array of addressable crossed line emitters 405 are static scanning, column-wise scanning, row-wise scanning, mixed column/row scanning, etc.

Figure 4B:
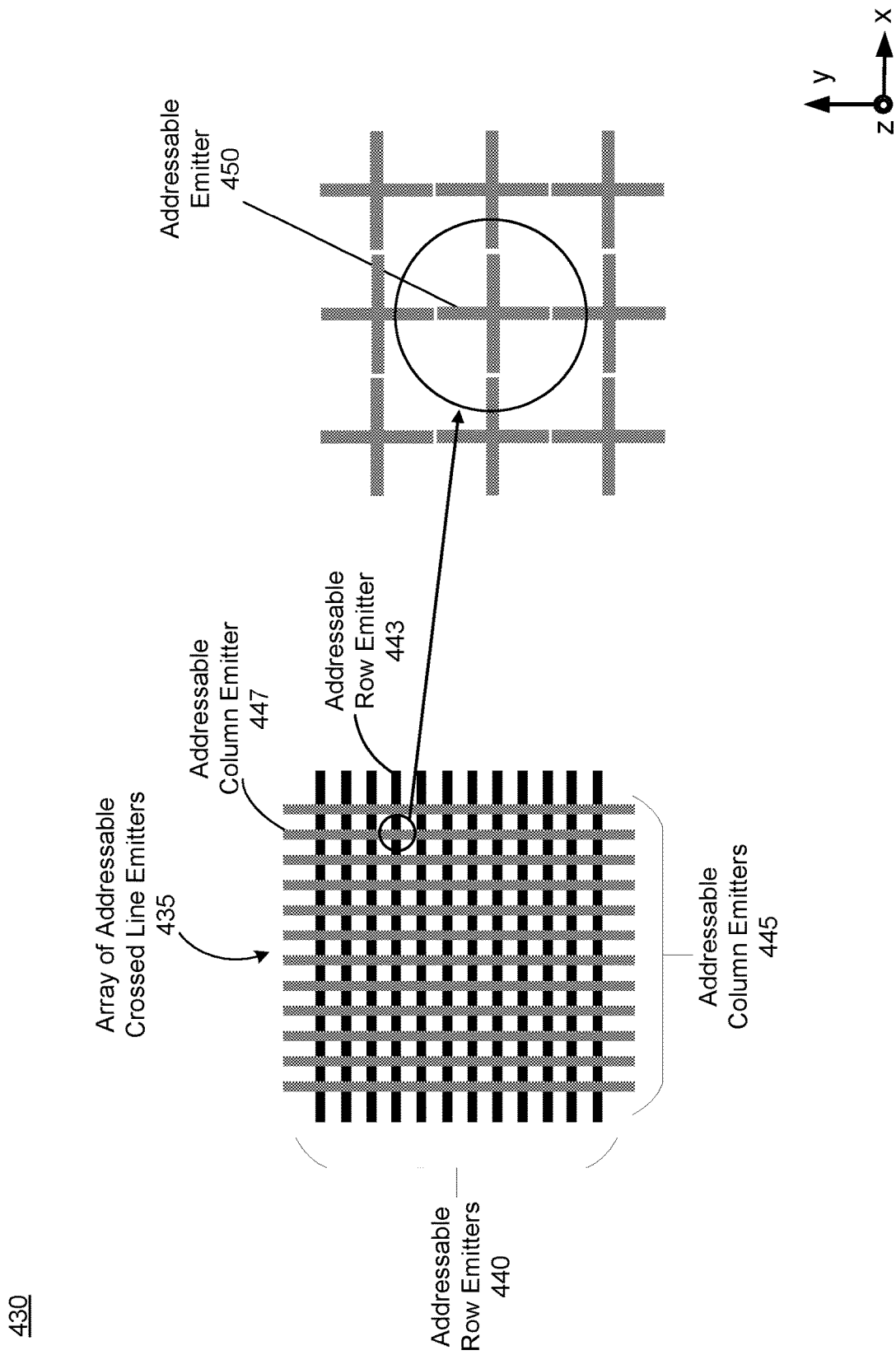
FIG. 4B is a top view of another array of addressable crossed line emitters in the emitter assembly, which may be part of the addressable crossed line projector in FIG. 3A, in accordance with one or more embodiments.

FIG. 4B is a top view 430 of an array of addressable crossed line emitters 435, which may be part of the addressable crossed line projector 305 in FIG. 3A, in accordance with one or more embodiments. The array of addressable crossed line emitters 435 may be an embodiment of the array of emitters 355 of FIG. 3B. The array of addressable crossed line emitters 435 is implemented as a two-dimensional array comprising an array of addressable row emitters 440 and an array of addressable column emitters 445. The array of addressable crossed line emitters 435 may be implemented as an array of VCSEL emitters as part of a VCSEL chip.

The array of addressable crossed line emitters 435 includes a plurality of cross shaped emitters. Each emitter having a cross shape is individually addressable. The cross shaped emitters are arranged in a grid like format to form the addressable row emitters 440 and the addressable column emitters 445. As shown in FIG. 4B, an individual addressable emitter 450 having a cross shape is positioned at an intersection between an addressable row emitter 443 and an addressable column emitter 445. In one embodiment, the addressable emitter 450 is implemented as a single emitter on a substrate having a cross shaped emission area. In another embodiment, the addressable emitter 450 is implemented as multiple emitters positioned on a substrate to form a cross shaped emission area. For example, the cross shaped emission area of the addressable emitter 450 can be formed by orthogonal crossing of two line segments, each line segment formed by one or more emitters. Alternatively, the cross shaped emission area of the addressable emitter 450 can be formed by a single emitter. Addressable emitters each having a same cross shape can be driven for emission in various ways, e.g., column wise, row wise, individually, or in groups combining at least one row and/or at least one column.

Figure 4C:
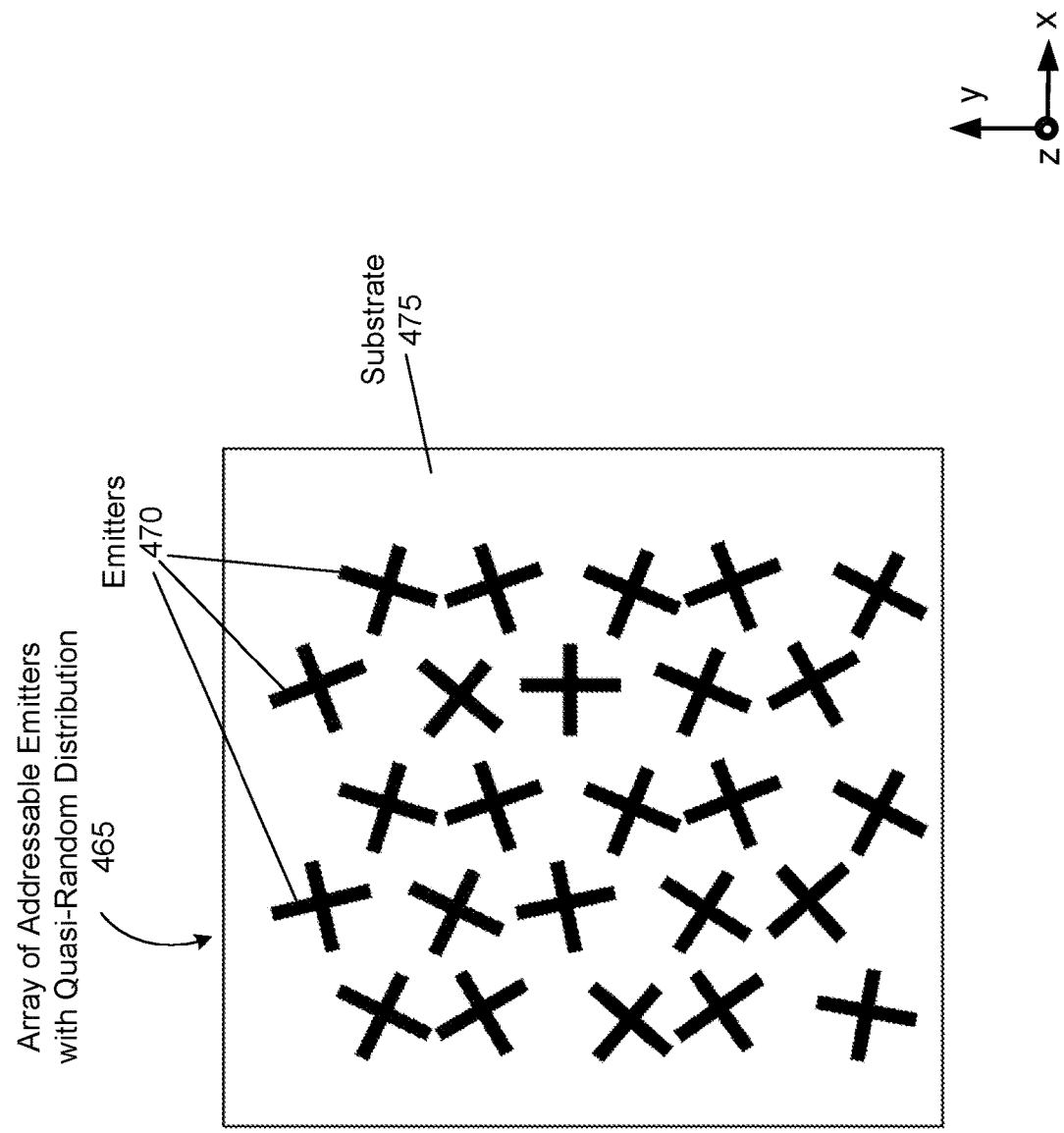
FIG. 4C is a top view of an array of addressable crossed line emitters in the emitter assembly having a quasi-random distribution in a substrate, which may be part of the addressable crossed line projector in FIG. 3A, in accordance with one or more embodiments.

FIG. 4C is a top view 460 of an array of addressable emitters 465 having a quasi-random distribution, which may be part of the addressable crossed line projector 305 in FIG. 3A, in accordance with one or more embodiments. The array of addressable emitters 465 may be an embodiment of the array of emitters 355 of FIG. 3B. As shown in FIG. 4C, emitters 470 in the array addressable emitters 465 may be implemented as cross shaped segments having a quasi-random distribution in a substrate 475. In some embodiments, the quasi-random distribution can be designed through a simulator that includes the projector 305, the imaging device 325 and instructions for depth processing stored at a non-transitory computer-readable storage medium causing, e.g., the controller 330 to perform depth processing operations. The quasi-random distribution designed in this manner can facilitate correspondence matching, and can be more robust to, e.g., noise and ambient light in comparison to regular lines/grids.

The substrate 475 may be an embodiment of the substrate 350 of FIG. 3B. The emitters 470 in the array 465 can be implemented as VCSEL emitters. In one embodiment, the addressable emitter 470 is implemented as a single emitter on the substrate 475 having a cross shaped emission area. In another embodiment, the addressable emitter 470 is implemented as multiple emitters arranged on the substrate to form a cross shaped emission area as shown in FIG. 4C. For example, the cross shaped emission area of the addressable emitter 470 can be formed by crossing of two line segments at an angle, each line segment formed by one or more emitters.

In general, the array of addressable emitters 465 includes a multitude of addressable emitters 470 that can be varying in shape or orientation of their respective emission areas. A random-like light pattern emitted by the addressable emitters 470 provides textures to a scene suitable for stereo vision depth sensing. The stereo version depth sensing requires a pattern of light as seen by cameras to be unique and robust when the correspondence match along the epipolar direction. The projected quasi-random pattern shown in FIG. 4B can ensure accurate stereo vision depth sensing. In some embodiments, the layout of emitters 470 can be optimized for stereo vision depth sensing, e.g., using a closed-loop modeling tool of a depth imaging system to optimize a projection pattern for achieving targeted depth performance requirements. The emitters 470 can be individually controlled or in groups, e.g., based on emission instructions from the controller 330.

Embodiments of an addressable crossed line projector shown in FIGS. 4A-4C are not limited to structured light and active stereo vision based depth sensing. The addressable crossed line projectors shown in FIGS. 4A-4C are also applicable to time-of-flight depth sensing, either in-direct or direct type (e.g., light detection and ranging (LIDAR)) with proper time-of-flight sensors. The projectors described in conjunction with FIGS. 4A-4C may have such advantages as high spatial light concentration and high-speed modulation, as well as the flexible addressability for power saving.

FIG. 5 is a flow chart illustrating a process 500 of illuminating a target area with light emitted by an array of emitters, in accordance with one or more embodiments. The process 500 of FIG. 5 may be performed by a projector, e.g., the projector 120 and/or the projector 305. Other entities (e.g., one or more other components of a DCA or an eye tracker) may perform some or all of the steps of the process in other embodiments. Likewise, embodiments may include different and/or additional steps, or perform the steps in different orders.

The projector receives 510 emission instructions for controlling operation of at least a portion of an array of emitters to emit light, the array of emitters positioned on a substrate according to a distribution and each emitter in the array of emitters has a non-circular emission area. In some embodiments, each emitter of the array of emitters in the projector is a VCSEL. In one embodiment, the emitters in the array are positioned on the substrate according to the distribution substantially similar to a grid distribution. In another embodiment, the emitters in the array are positioned on the substrate according to the distribution substantially similar to a quasi-random distribution. In some embodiments, the emitters in the array are positioned on the substrate according to a predetermined distribution to mitigate distortion of the light by a projection assembly that projects the light into the local area.

The projector illuminates 520 a target area with the light emitted by at least the portion of the array of emitters. The light emitted from the projector may include a pattern of repeated non-circular shapes, where each shape is defined by one or more respective non-circular emission areas of emitters within the array of emitters. The emitted light may illuminate one or more non-circular shapes of the target area defined by a shape of a pattern of the light as appears on a surface within the target area. The non-circular emission area may be a line segment, cross segment, or of some other non-circular shape.

In some embodiments, the projector is part of a DCA that includes an imaging device and a controller. The imaging device captures one or more images of at least a portion of the light reflected from one or more objects in the target area. The controller generates the emission instructions, provides the emission instructions to the projector, and determines depth information for the one or more objects based in part on the captured one or more images. The DCA may provide the determined depth information to a console coupled to the headset that generates content for presentation on a display of the headset, based on the depth information. Alternatively, the DCA provides the determined depth information to a module of the headset that generates content for presentation on the display of the headset, based on the depth information.

The DCA with the projector presented herein may be integrated into a headset as part of an AR system. In this case, the headset may be configured to sense and display objects behind a head of a user wearing the headset or display objects recorded previously. Alternatively, the DCA with the projector may be integrated into a base station or a sensor bar external to the headset. In this case, the DCA may be configured to sense various body parts of a user wearing the headset or portions of an environment, e.g., for recording the geometry of a user or a local area, hand-tracking, eye-tracking, face recognition, gesture recognition, environment scanning, environment reconstruction, etc. In some embodiments, the DCA with the projector is integrated into a portable computing platform (e.g., a mobile phone or tablet).

In some other embodiments, the projector presented herein is part of an eye tracker, and the light from the projector illuminates the target area that includes an eye box of a headset. An imaging device of the eye tracker captures one or more images of at least a portion of the light reflected from at least one surface of an eye in the eye box. A controller of the eye tracker determines position and orientation of the eye in the eye box (e.g., gaze direction for eye) based on the captured one or more images.

System Environment

Figure 6:
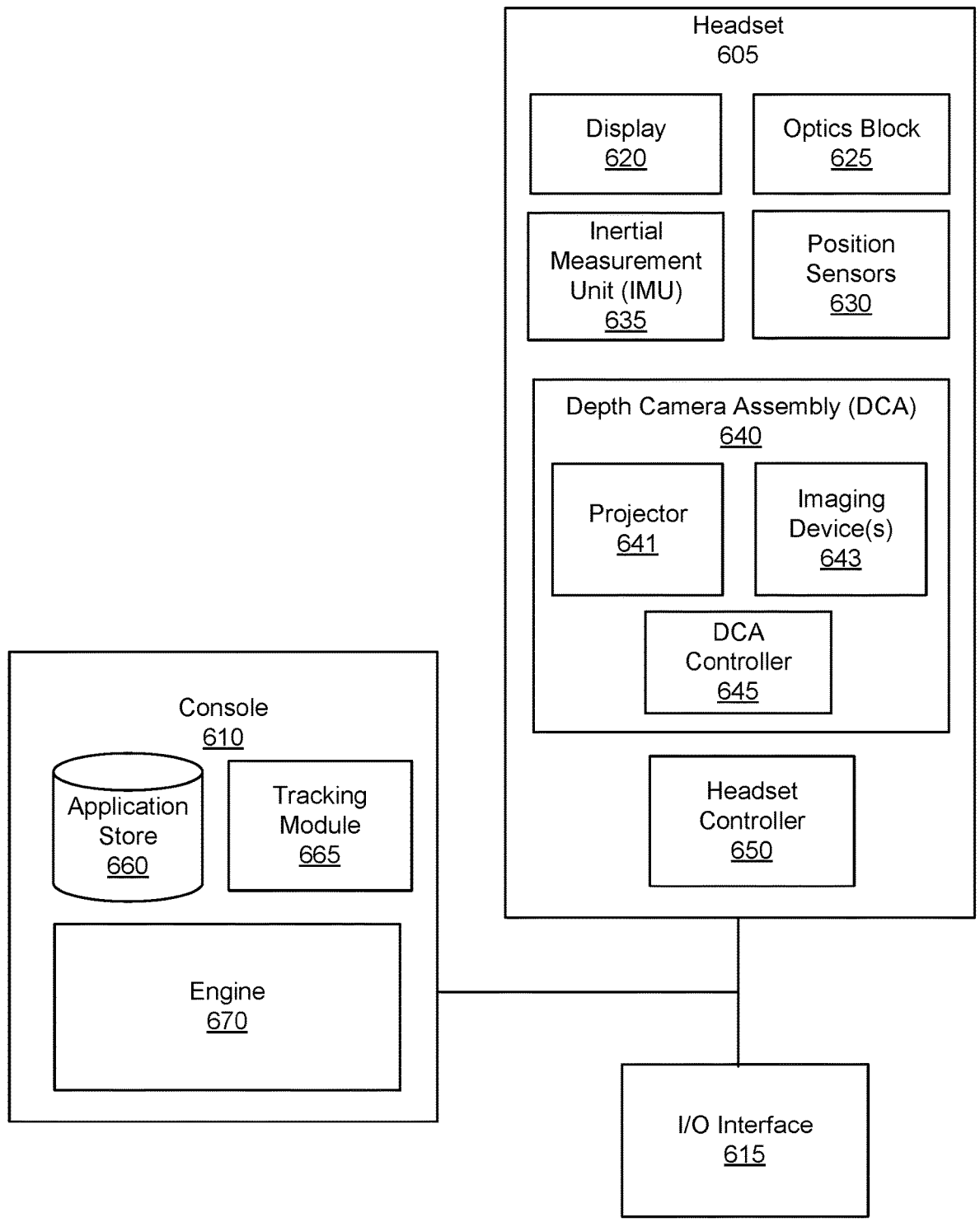
FIG. 6 is a block diagram of a system environment that includes a headset, in accordance with one or more embodiments.

FIG. 6 is a block diagram of a system environment that includes a headset, in accordance with one or more embodiments. The system 600 may operate in an artificial reality environment, e.g., a virtual reality, an augmented reality, a mixed reality environment, or some combination thereof.

The system 600 shown by FIG. 6 comprises a headset 605 and an input/output (I/O) interface 615 that is coupled to a console 610. While FIG. 6 shows an example system 600 including one headset 605 and on I/O interface 615, in other embodiments any number of these components may be included in the system 600. For example, there may be multiple headsets 605 each having an associated I/O interface 615, with each headset 605 and I/O interface 615 communicating with the console 610. In alternative configurations, different and/or additional components may be included in the system 600. Additionally, functionality described in conjunction with one or more of the components shown in FIG. 6 may be distributed among the components in a different manner than described in conjunction with FIG. 6 in some embodiments. For example, some or all of the functionality of the console 610 is provided by the headset 605.

The headset 605 is a NED or a HMD that presents content to a user comprising virtual and/or augmented views of a physical, real-world environment with computer-generated elements (e.g., two-dimensional or three-dimensional images, two-dimensional or three-dimensional video, sound, etc.). In some embodiments, the presented content includes audio that is presented via an external device (e.g., speakers and/or headphones) that receives audio information from the headset 605, the console 610, or both, and presents audio data based on the audio information. The headset 605 may comprise one or more rigid bodies, which may be rigidly or non-rigidly coupled together. A rigid coupling between rigid bodies causes the coupled rigid bodies to act as a single rigid entity. In contrast, a non-rigid coupling between rigid bodies allows the rigid bodies to move relative to each other. An embodiment of the headset 605 is the headset 100 of FIG. 1A implemented as a NED. Another embodiment of the headset 605 is the headset 200 of FIG. 2A implemented as a HMD.

The headset 605 may include a display 620, an optics block 625, one or more position sensors 630, an IMU 635, a DCA 640, and a headset controller 650. Some embodiments of the headset 605 have different and/or additional components than those described in conjunction with FIG. 6. Additionally, the functionality provided by various components described in conjunction with FIG. 6 may be differently distributed among the components of the headset 605 in other embodiments.

The display 620 displays two-dimensional or three-dimensional images to the user in accordance with data received from the console 610. In various embodiments, the display 620 comprises a single display or multiple displays (e.g., a display for each eye of a user). Examples of the display 620 include: a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, a laser-based display, one or more waveguides, some other display, a scanner, one-dimensional array, or some combination thereof. Content displayed on the display 620 may include the depth information determined by the DCA 640. An embodiment of the display 620 is the display assembly 140.

The optics block 625 magnifies image light received from the display 620, corrects optical errors associated with the image light, and presents the corrected image light to a user of the headset 605. In various embodiments, the optics block 625 includes one or more optical elements. Example optical elements included in the optics block 625 include: an aperture, a Fresnel lens, a convex lens, a concave lens, a filter, a reflecting surface, or any other suitable optical element that affects image light. Moreover, the optics block 625 may include combinations of different optical elements. In some embodiments, one or more of the optical elements in the optics block 625 may have one or more coatings, such as partially reflective or anti-reflective coatings.

Magnification and focusing of the image light by the optics block 625 allows the display 620 to be physically smaller, weigh less, and consume less power than larger displays. Additionally, magnification may increase the field of view of the content presented by the display 620. For example, the field of view of the displayed content is such that the displayed content is presented using almost all (e.g., approximately 110 degrees diagonal), and in some cases all, of the user's field of view. Additionally, in some embodiments, the amount of magnification may be adjusted by adding or removing optical elements.

In some embodiments, the optics block 625 may be designed to correct one or more types of optical error. Examples of optical error include barrel or pincushion distortion, longitudinal chromatic aberrations, or transverse chromatic aberrations. Other types of optical errors may further include spherical aberrations, chromatic aberrations, or errors due to the lens field curvature, astigmatisms, or any other type of optical error. In some embodiments, content provided to the electronic display for display is pre-distorted, and the optics block 625 corrects the distortion when it receives image light from the electronic display generated based on the content. An embodiment of the optics block 625 is the optical assembly 240.

The IMU 635 is an electronic device that generates data indicating a position of the headset 605 based on measurement signals received from one or more of the position sensors 630. A position sensor 630 generates one or more measurement signals in response to motion of the headset 605. Examples of position sensors 630 include: one or more accelerometers, one or more gyroscopes, one or more magnetometers, another suitable type of sensor that detects motion, a type of sensor used for error correction of the IMU 635, or some combination thereof. The position sensors 630 may be located external to the IMU 635, internal to the IMU 635, or some combination thereof. An embodiment of the position sensor 635 is the position sensor 130.

The DCA 640 includes a projector 641, one or more imaging devices 643 and a DCA controller 645. The DCA 640 generates depth image data of a local area surrounding some or all of the headset 605. Depth image data includes pixel values defining distance from the imaging device, and thus provides a (e.g., 3D) mapping of locations captured in the depth image data. An embodiment of the DCA 640 is the DCA 145 of FIG. 1B or the DCA 260 of FIG. 2B, an embodiment of the projector 641 is the projector 120, an embodiment of the imaging device 643 is the imaging device 115, and an embodiment of the DCA controller 645 is the DCA controller 160.

In some embodiments, the DCA 640 generates depth image data using the structured light depth sensing technique. The DCA 640 may emit structured light and determine depth information for the local area by capturing reflected and deformed structured light pattern. In some other embodiments, the DCA 640 generates depth image data using the time-of-flight depth sensing technique. The DCA 640 may generate the depth image data based on time required for light to be emitted from the projector 641 until at least a portion of the light reflected from one or more objects in the local area is captured by the one or more imaging devices 643. In some other embodiments, the DCA 640 generates depth image data using active or passive stereo imaging. By comparing information about a local area from two vantage points, the DCA 640 may extract depth information based on relative positions of objects in two panels.

The projector 641 includes an array of emitters positioned on a substrate according to a distribution, e.g., a grid distribution, a quasi-random distribution, etc. Each emitter in the array of emitters having a non-circular emission area, e.g., a line segment, a cross segment, etc. Operation of at least a portion of the array of emitters being controlled based in part on emission instructions to emit light. The light from the projector 641 is configured to illuminate a local area surrounding the headset 605. The light from the projector 641 may include a pattern of repeated non-circular shapes, where each shape is defined by one or more respective non-circular emission areas of emitters within the array of emitters. The light from the projector 641 may illuminate one or more non-circular shapes of the local area defined by a shape of a pattern of the light as appears on a surface within the local area. Each emitter of the array of emitters of the projector 641 is a VCSEL. In some embodiments, the same type of the projector as the projector 641 can be part of an eye tracker integrated into a headset 605 (not shown in FIG. 6) that illuminates one of more surfaces of an eye located in an eye box of the headset 605. The eye tracker may capture light reflected from the one of more eye surfaces and determine a gaze direction for the eye based on the captured light.

The DCA controller 645 may generate emission instructions and provide the emission instructions to the projector 641 to control operation of at least a portion of the emitters in the projector 641. In one embodiment, the DCA controller 645 controls operation of at least the portion of emitters in the projector 641 by controlling at least one column of the emitters. In another embodiment, the DCA controller 645 controls operation of at least the portion of emitters in the projector 641 by controlling operation of at least one emitter in the array of emitters. The DCA controller 645 may further generate the depth image data based on light captured by the one or more imaging devices 643 by using structed light depth sensing techniques, time-of-flight depth sensing techniques, stereo based depth sensing techniques, some other depth sensing technique, or combination thereof. The DCA controller 645 may provide the depth image data to the console 610, the headset controller 650, or some other component. In some embodiments, the DCA controller 645 controls operation of one or more emitters in the projector 641, based at least in part on the depth image data.

The I/O interface 615 is a device that allows a user to send action requests and receive responses from the console 610. An action request is a request to perform a particular action. For example, an action request may be an instruction to start or end capture of image or video data or an instruction to perform a particular action within an application. The I/O interface 615 may include one or more input devices. Example input devices include: a keyboard, a mouse, a game controller, or any other suitable device for receiving action requests and communicating the action requests to the console 610. An action request received by the I/O interface 615 is communicated to the console 610, which performs an action corresponding to the action request. In some embodiments, the I/O interface 615 includes an IMU 635 that captures calibration data indicating an estimated position of the I/O interface 615 relative to an initial position of the I/O interface 615. In some embodiments, the I/O interface 615 may provide haptic feedback to the user in accordance with instructions received from the console 610. For example, haptic feedback is provided when an action request is received, or the console 610 communicates instructions to the I/O interface 615 causing the I/O interface 615 to generate haptic feedback when the console 610 performs an action.

The console 610 provides content to the headset 605 for processing in accordance with information received from one or more of: the DCA 640, the headset controller 650, and the I/O interface 615. In the example shown in FIG. 6, the console 610 includes an application store 660, a tracking module 665, and an engine 670. Some embodiments of the console 610 have different modules or components than those described in conjunction with FIG. 6. Similarly, the functions further described below may be distributed among components of the console 610 in a different manner than described in conjunction with FIG. 6.

The application store 660 stores one or more applications for execution by the console 610. An application is a group of instructions, that when executed by a processor, generates content for presentation to the user. Content generated by an application may be in response to inputs received from the user via movement of the headset 605 or the I/O interface 615. Examples of applications include: gaming applications, conferencing applications, video playback applications, or other suitable applications.

The tracking module 665 calibrates the system 600 using one or more calibration parameters and may adjust one or more calibration parameters to reduce error in determination of the position of the headset 605 or of the I/O interface 615. For example, the tracking module 665 communicates a calibration parameter to the DCA 640 to adjust the focus of the DCA 640 to more accurately determine positions of structured light elements captured by the DCA 640. Calibration performed by the tracking module 665 also accounts for information received from the IMU 635 in the headset 605 and/or an IMU included in the I/O interface 615. Additionally, if tracking of the headset 605 is lost (e.g., the DCA 640 loses line of sight of at least a threshold number of structured light elements), the tracking module 665 may re-calibrate some or all of the system 600.

The tracking module 665 tracks movements of the headset 605 or of the I/O interface 615 using information from the DCA 640, the one or more position sensors 630, the IMU 635, or some combination thereof. For example, the tracking module 665 determines a position of a reference point of the headset 605 in a mapping of a local area based on information from the headset 605. The tracking module 665 may also determine positions of the reference point of the headset 605 or a reference point of the I/O interface 615 using data indicating a position of the headset 605 from the IMU 635 or using data indicating a position of the I/O interface 615 from an IMU 635 included in the I/O interface 615, respectively. Additionally, in some embodiments, the tracking module 665 may use portions of data indicating a position or the headset 605 from the IMU 625 as well as representations of the local area from the DCA 640 to predict a future location of the headset 605. The tracking module 665 provides the estimated or predicted future position of the headset 605 or the I/O interface 615 to the engine 670.

The engine 670 generates a three-dimensional mapping of the area surrounding the headset 605 (i.e., the "local area") based on information received from the headset 605. In some embodiments, the engine 670 determines depth information for the three-dimensional mapping of the local area based on information received from the DCA 640 that is relevant for techniques used in computing depth. The engine 670 may calculate depth information using one or more techniques in computing depth from the portion of the reflected light detected by the DCA 640, such as the stereo based techniques, the structured light illumination techniques, and the time-of-flight techniques. In various embodiments, the engine 670 uses the depth information to, e.g., update a model of the local area, and generate content based in part on the updated model.

The engine 670 also executes applications within the system 600 and receives position information, acceleration information, velocity information, predicted future positions, or some combination thereof, of the headset 605 from the tracking module 665. Based on the received information, the engine 670 determines content to provide to the headset 605 for presentation to the user. For example, if the received information indicates that the user has looked to the left, the engine 670 generates content for the headset 605 that mirrors the user's movement in a virtual environment or in an environment augmenting the local area with additional content. Additionally, the engine 670 performs an action within an application executing on the console 610 in response to an action request received from the I/O interface 615 and provides feedback to the user that the action was performed. The provided feedback may be visual or audible feedback via the headset 605 or haptic feedback via the I/O interface 615.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A projector comprising:
   an array of emitters positioned on a substrate according to a distribution and an overall emission area of each emitter in the array of emitters is non-circular, operation of at least a portion of the array of emitters being controlled based in part on emission instructions to emit light, wherein
   the light from the projector is configured to illuminate a target area, and
   each emitter positioned on the substrate has a shape of cross.

2. The projector of claim 1, wherein the projector is part of a depth camera assembly (DCA) comprising:
   an imaging device configured to capture one or more images of at least a portion of the light reflected from one or more objects in the target area; and
   a controller configured to:
   generate the emission instructions,
   provide the emission instructions to the projector, and
   determine depth information for the one or more objects based in part on the captured one or more images.

3. The projector of claim 1, wherein each emitter of the array of emitters is a vertical cavity surface emitting laser (VCSEL).

4. The projector of claim 1, wherein the light includes a pattern of repeated non-circular shapes, where each shape is defined by one or more respective non-circular emission areas of emitters within the array of emitters.

5. The projector of claim 1, wherein the light illuminates one or more non-circular shapes of the target area defined by a shape of a pattern of the light as appears on a surface within the target area.

6. The projector of claim 1, wherein the emitters in the array are positioned on the substrate according to the distribution substantially similar to a grid distribution.

7. The projector of claim 1, wherein the emitters in the array are positioned on the substrate according to the distribution substantially similar to a quasi-random distribution.

8. The projector of claim 1, wherein the emitters in the array are positioned on the substrate according to the distribution to mitigate distortion of the light by a projection assembly that projects the light into the target area.

9. The projector of claim 1, wherein the projector further comprises a controller configured to:
   control operation of at least the portion of emitters by controlling at least one column of the emitters.

10. The projector of claim 1, wherein the projector further comprises a controller configured to:
    control operation of at least the portion of emitters by controlling operation of at least one emitter in the array of emitters.

11. The projector of claim 1, wherein the projector further comprises a controller configured to:
    control operation of one or more emitters in the array, based at least in part on depth information for the target area.

12. The projector of claim 1, wherein the projector is part of a headset and the light from the projector illuminates the target area that includes a local area surrounding at least a portion of the headset.

13. The projector of claim 1, wherein the projector is part of an eye tracker and the light from the projector illuminates the target area that includes an eye box of a headset.

14. A method comprising:
    receiving emission instructions for controlling operation of at least a portion of an array of emitters to emit light, the array of emitters positioned on a substrate according to a distribution, an overall emission area of each emitter in the array of emitters is non-circular, and each emitter positioned on the substrate has a shape of cross; and
    illuminating a target area with the light emitted by at least the portion of the array of emitters.

15. The method of claim 14, wherein each emitter of the array of emitters is a vertical cavity surface emitting laser (VCSEL).

16. The method of claim 14, wherein the light includes a pattern of repeated non-circular shapes, where each shape is defined by one or more respective non-circular emission areas of emitters within the array of emitters.

17. The method of claim 14, further comprising:
    activating at least one column of the emitters to emit the light based at least in part on the emission instructions.

18. The method of claim 14, further comprising:
    activating at least one emitter in the array of emitters to emit the light based at least in part on the emission instructions.

* * * * *